(12) United States Patent
Zheludev et al.

(10) Patent No.: US 8,780,677 B2
(45) Date of Patent: Jul. 15, 2014

(54) MAGNETIC FIELD GENERATOR

(71) Applicant: University of Southampton, Southampton (GB)

(72) Inventors: Nikolay Ivanovich Zheludev, Southampton (GB); Vassili A Fedotov, Southampton (GB); Anagnostis Tsiatmas, Southampton (GB); Francisco Javier Garcia De Abajo, Southampton (GB); William James Stewart, Southampton (GB)

(73) Assignee: University of Southampton, Southampton (GB)

( * ) Notice: Subject to any disclaimer, the term of this patent is extended or adjusted under 35 U.S.C. 154(b) by 0 days.

(21) Appl. No.: 13/733,338

(22) Filed: Jan. 3, 2013

(65) Prior Publication Data
US 2013/0176836 A1 Jul. 11, 2013

(30) Foreign Application Priority Data
Jan. 6, 2012 (GB) .................................. 1200186.3

(51) Int. Cl.
*G11B 11/00* (2006.01)
(52) U.S. Cl.
USPC ....................................................... 369/13.17
(58) Field of Classification Search
USPC .......... 369/13.01, 13.02, 13.13, 13.14, 13.17; 360/59
See application file for complete search history.

(56) References Cited

U.S. PATENT DOCUMENTS

| | | | | |
|---|---|---|---|---|
| 3,187,335 | A * | 6/1965 | Fay, III | 360/59 |
| 3,686,468 | A * | 8/1972 | Garnier, Jr. | 360/125.01 |
| 6,882,617 | B1 * | 4/2005 | Katayama | 428/831 |
| 7,593,184 | B2 * | 9/2009 | Clinton et al. | 360/125.01 |
| 7,688,036 | B2 * | 3/2010 | Yarger et al. | 320/137 |
| 8,144,425 | B2 * | 3/2012 | Clinton et al. | 360/125.01 |
| 2007/0064544 | A1 * | 3/2007 | Okamoto | 369/13.33 |
| 2011/0317528 | A1 * | 12/2011 | Miyauchi et al. | 369/13.24 |

* cited by examiner

*Primary Examiner* — Brenda Bernardi
(74) *Attorney, Agent, or Firm* — Renner, Otto, Boisselle & Sklar, LLP

(57) ABSTRACT

A metallic ring is made of two metals, wherein one metal forms a major arcuate portion and the other a minor arcuate portion of the ring, thereby forming a thermocouple-type structure as a result of the two inter-metallic junctions. The metallic ring supports a surface plasmon whose energy is matched to the energy, i.e. wavelength, of an incident light beam so that the oscillating electromagnetic field of the light resonates with the plasmon. The resonating plasmon causes a temperature difference to arise between the two inter-metallic junctions in the ring. The different Seebeck coefficients of the two metals results in the temperature difference causing a net current to flow around the ring, which in turn generates a magnetic field. Such a thermoelectric metamaterial ring transforms high frequency optical energy into long duration magnetic radiation pulses in the terahertz range. Applications of these devices include high density magnetic recording, magnetic field spectroscopy, and efficient terahertz radiation sources.

20 Claims, 14 Drawing Sheets

MAGNETIC FIELD GENERATOR

This application claims priority of United Kingdom Patent Application No. 1200186.3 filed Jan. 6, 2012, this application being fully incorporated herewith by reference.

BACKGROUND OF THE INVENTION

The invention relates to devices for generating magnetic fields.

Magnetic recording requires relatively high magnetic fields to be produced locally in order to fix the orientation of small magnetic domains on the surface of a magnetic disk. The demand is for ever-increased surface density coupled with stability of the magnetic domains, so once data is written it does not change. These requirements effectively mean that the ideal magnetic material should have high coercivity. However, the higher the coercivity, the greater the magnetic field required to set the domain orientation and hence write a bit of data.

Longitudinal magnetic recording (LMR) is the conventional approach for recording data on magnetic discs. Magnetic domains are aligned with the plane of the magnetic disc and the writing element is formed by the open poles of a ring magnet arranged sideways above the recording layer, referred to as a "ring" writing element. Longitudinal recording has an estimated density limit of 100-200 Gbits per square inch. The super-paramagnetic effect is performance limiting. Stronger magnetic fields are required to record data on materials with high coercivity and small domain size.

Perpendicular magnetic recording (PMR) is a more recently developed approach for recording data on magnetic discs. Magnetic domains in the recording layer are aligned perpendicular to the plane of the magnetic disc. An additional soft magnetic layer is arranged underneath the recording layer and cooperates with a monopole writing element to direct magnetic field directly down through the recording layer. PMR can produce higher data densities than LMR, perhaps by a factor of 5.

Because magnetic field generators are at their limit, an enhancement that has been proposed for magnetic recording is so-called heat assisted magnetic recording (HAMR). HAMR exploits the fact that the coercivity of a magnetic material and hence its switching threshold reduces with increasing temperature, so by heating the disc locally in the region where the data is to be written, the magnetic field required to effect writing is reduced. Local heating can be provided by a focused laser beam. In 2009, HAMR devices achieved a density of 250 Gbits per square inch. It is predicted that data storage densities of 1 terabit per square inch or more will be achievable with HAMR. Mainstream commercial adoption of HAMR is expected by 2015.

SUMMARY OF THE INVENTION

According to one aspect of the invention, there is provided a device for generating a magnetic field, comprising: a light source operable to generate pulses of light of a particular wavelength, the light having an oscillating electromagnetic field with a defined polarization; and a field generator arranged to receive the light and comprising a closed current path having first and second angular portions of first and second materials interconnected by first and second junctions; wherein the closed current path comprises electrons or holes which absorb energy from each pulse of light and are thereby transiently heated; and wherein the polarization of the light is aligned relative to the closed current path so that each pulse of light causes different amounts of transient heating of the electrons at the first and second junctions so that one of the junctions becomes hotter than the other, which causes a thermally induced transient current to flow around the closed current path, thereby generating a transient electromagnetic field. The transient electromagnetic field may be a transient magnetic field or a pulse of electromagnetic radiation, for example.

In one group of embodiments, the first and second materials are metallic and have first and second Seebeck coefficients which are different and the first and second junctions are ohmic, and wherein the absorption of the light is plasmonic. The first and second junctions are separated angularly by approximately 90 degrees, wherein approximately indicates a range of one of: ±45, ±30, ±20, or ±10 degrees, or any other intermediate of nearby ranges.

By making the pulse shorter than the thermal relaxation time of electrons or holes in relation to the host atoms of the material, the electrons or holes can be heated to enhance the thermoelectric effect over what is achievable at thermal equilibrium between the electrons or holes and the host lattice.

More efficient absorption can be achieved if the closed current path has a resonance of electron (or hole) oscillations at an energy matched to the wavelength of the light source so that in use the electrons or holes resonantly absorb energy from each pulse of light and are thereby transiently heated. (In other words, the charge carriers can be electrons or holes.) Alternatively, the light could be of a wavelength which is not matched to any particular resonance of the nano-structure, in which case the light will heat the desired parts of the nano-structure by non-resonant absorption.

For example, the pulse may be made short enough and intense enough to transiently heat charge carriers to a temperature of at least 1000, 2000, 3000, 4000, 5000, 6000, 7000 or 8000 Kelvin, or any other intermediate of nearby ranges.

In most materials, the principal electron cooling mechanism is likely to be via lattice vibrations, i.e. phonons. The thermal relaxation time of "hot" charge carriers will then be determined by the characteristic electron-phonon scattering time. Pulse durations are therefore preferably chosen to be shorter than the electron-phonon scattering times of the first and second materials so that the pulse can heat up the charge carriers faster than they can cool by electron-phonon scattering. In principle the shape of the pulse can be arbitrary; what is important is that the pulse acts as a sudden impulse on the thermal state of the electron gas to create hot electrons by enough photon absorption occurring over a short enough period of time. Pulses of any desired shape may be delivered as trains of pulses, pulse fronts, etc. intended to enhance or control the deposited energy and the temperature difference of the thermocouple junctions, for example, through the use of CCD pulse shapers.

For example, the pulse duration is at least 2, 5, 10 or 20 times shorter than the shorter of the first and second electron-phonon scattering times.

Example absolute times for the pulse durations would be less than 300, 200, 100, 50 femtoseconds. Note that the absorption time of metals for light in the visible and near infra-red is determined by the period of one optical cycle of the light multiplied by the Q-factor of the resonance, which is likely to be of the order of femtoseconds. The absorption time is effectively the time needed for the ring resonator to reach a steady state. For example, with a Q-factor of 6.6 and an optical period of 3 fs, around 20 fs are needed to reach steady state. Although it is not necessary for the device to operate that the light excites the ring to a steady state, it is much easier to model, and hence much easier to design a device, if steady state operation is reached. In other words, the optical pulse length should be sufficiently long to ensure that the ring resonator reaches steady state. Example absolute times for the pulse durations for reaching steady state may thus be more than 10, 20, 30, 40 or 50 femtoseconds.

The interval between pulses is preferably long enough to allow the electrons or holes and the lattice to reach thermal equilibrium and cool between adjacent pulses.

The closed current path can be shaped as a closed loop, for example in a ring shape. The closed loop may be circular or irregularly shaped. In one variant, the closed loop is shaped as first and second incomplete rings of different size joined together such that the interiors of the incomplete rings form connected spaces, wherein one of the incomplete rings is dimensioned to optimize the resonance and the other of the incomplete rings is dimensioned to optimize the transient magnetic field, for example in terms of its magnitude and/or extent. Another variant is where the closed current path is formed from a sheet of the first material in which an aperture or hole is made (or an array of holes) and the second material is formed local to the hole such that a portion of the rim of the hole is made of the second material. Yet more variants are possible, such as providing a junction between the first and second materials and a circuit of varied shape including a simple rod-like circuit in which the magnetic field is produced near said materials and their junction.

Some devices may incorporate multiple closed current paths in a common host. For example, further rings can be provided with said ring so that the rings form an array. The light source can be arranged to direct light to cover the array of rings, so that the array of rings collectively generates a transient magnetic field. Alternatively, the light source may be directed to activate the rings singly or multiply at the same time. The rings may be arranged in one or more sheets, e.g. planar or curved sheets. The rings may also be distributed in any desired arrangement in a three-dimensional material.

In some embodiments, the device is provided with a cooling element which is arranged in thermal connection with the field generator and operable to lower at least a part of the closed current path to a temperature at which it is superconducting. The overall resistance of the current path is thereby reduced and the strength of the magnetic field increased.

In some embodiments, the device is provided with a heat dissipation structure, such as protuberances which may be made of metal or another good thermal conductor, to assist removal of heat generated by the induced current. The heat dissipation structure should be shaped, arranged and made of a material which does not interfere with the optical coupling between the closed current loop and the incident light pulses.

The specification of the host material in which the nano-rings are carried is not particularly stringent. Good host materials will not have undesired active properties, so might be non-magnetic, non-electrically-conductive and optically transparent to the plasmon resonance wavelength so that the host does not absorb the incident light beam. High thermal conductivity is also a desirable property of the host material in order to dissipate the local heating induced by the current loop. A good host will also be compatible with whatever nanostructure processing is used. Silica is a suitable material. Other hosts could be considered, such as other glass materials, e.g. germania, and semiconductor materials such as silicon or germanium, gallium arsenide or another III-V compound. Diamond and sapphire are other candidate host materials. In some applications the host will deliberately be given active properties, such as being magnetic in the case of a volumetric memory. The nano-rings may also either be carried on the surface of the host or embedded depending on convenience of processing and what is desirable from the intended application.

An important application of such devices is as part of a magnetic recording head. Further aspects of the invention therefore relate to a magnetic recording head having a write pole made from a magnetic field generating device according to the above, and to a magnetic disc drive system comprising: a magnetic recording medium comprising a large number of magnetic domains whose alignment is used to encode data; a magnetic recording head movable over a surface of said magnetic recording medium in order to apply a local magnetic field greater than a recording coercive field of the magnetic recording medium to selected locations of the magnetic recording medium, thereby to define alignment of magnetic domains at those locations.

It is a known problem that magnetic field sources are not available with sufficient strength. By way of background, the recording coercive field (Hc) is the field necessary to align a magnetic domain in the recording medium, which is proportional to the magnetic anisotropy energy density (Ku). Therefore to satisfy the inevitable demand for higher and higher densities of data to be stored, it is necessary to make the magnetic domains smaller and smaller, which means that the magnetic field strength required to align the domains becomes higher and higher. The fact that magnetic field sources could not be provided with sufficient field strength has led to the development of heat assisted magnetic recording (HAMR) which is based on the idea of incorporating a local heater in the recording head to heat the region of the domain to be aligned and thereby reduce its coercive field. The magnetic field sources disclosed herein should be able to provide extremely high magnetic field strengths and thereby remove the limitation from design of magnetic recording heads. The magnetic field sources could be used in a non-heated magnetic recording head to avoid the need for heating, and could also be used in a heated magnetic recording head, wherein if desired the incident light beam could be used to provide the local heating of the magnetic medium as well as inducing the magnetic field in the nano-ring, since the two effects would self align given they are both induced by the same focused light spot.

In HAMR implementations, the closed current path, e.g. the nano-ring, acts as a self-aligning mask to locally heat the magnetic recording medium and thereby provide heat assisted magnetic recording. The said light from the light source can provide the local heating for the HAMR. Alternatively, other light, for example having a different wavelength, can be used to provide the local heating for HAMR in which case it may be convenient to provide a common light routing path for directing the said light from the light source and the further light for the HAMR onto a common point or area corresponding to the closed current path and underlying region of the magnetic recording medium. The common light routing path could be provided by common focusing optics, e.g. an objective lens, and/or by a common waveguide, e.g. an optical fiber or a plasmonic waveguide. The nano-ring will generally be opaque to the magnetic-field inducing light and, depending on the wavelength, may also be opaque to the heat-inducing light if it is different light. To write data, the magnetic domains are aligned according to modulation of the light source by data to be written. The modulation may be of the ultimate source, e.g. a laser drive current, or of a separate optical modulator.

The magnetic field sources disclosed herein can be used both for longitudinal recording, i.e. with the domains aligned parallel to the surface of the recording medium, and for perpendicular recording, i.e. with the domains aligned perpendicular to the surface of the recording medium. In all cases, the greater magnetic field strength achievable by magnetic field sources disclosed herein will allow improvements in data storage density.

The magnetic field source as described herein can be used for a wide variety of further applications in which a magnetic field is required, for example spectroscopy, terahertz radiation sources, and photodetetectors.

In some alternative embodiments, the first and second materials are semiconductors and the first and/or second junctions are p-n junctions, and wherein the resonance is between a valence band and a conduction band of at least one of the semiconductors.

In other alternative embodiments, the first and second materials are metallic and the first and/or second junctions are metal-insulator-metal tunnel junctions formed by an insulator interposed between the first and second materials.

BRIEF DESCRIPTION OF THE DRAWINGS

The invention is now described by way of example only with reference to the following drawings.

DETAILED DESCRIPTION

Figure 1:
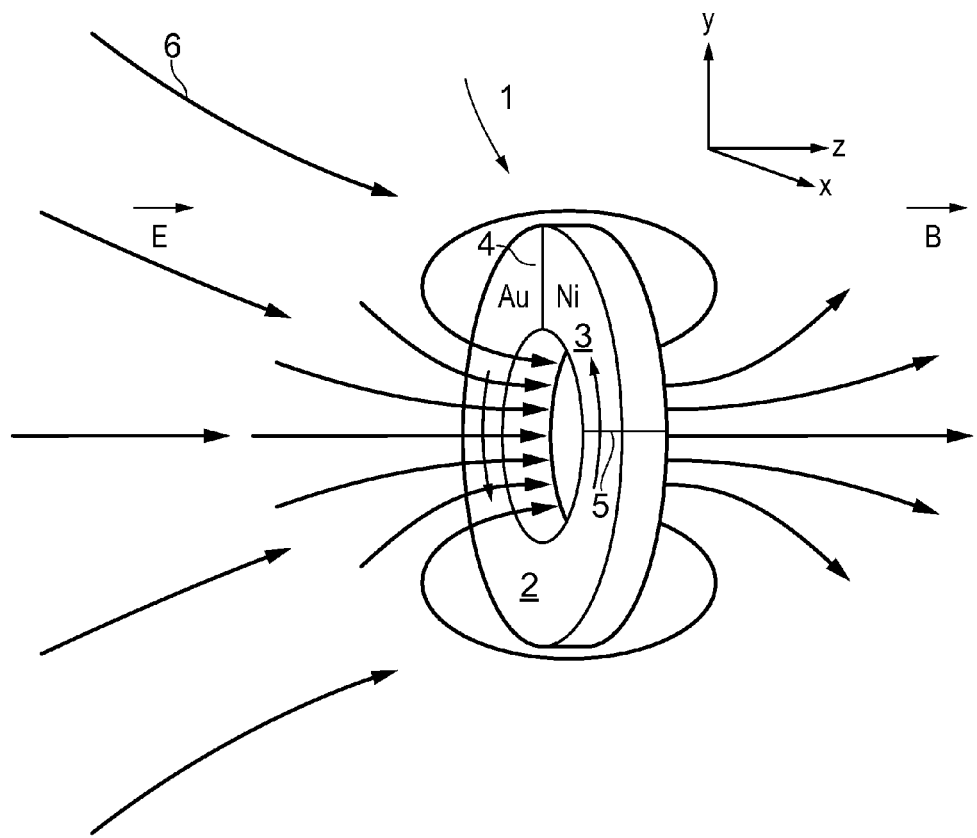
FIG. 1 is a conceptual representation of an example Au—Ni ring generating a magnetic field B in response to being resonantly excited by a focused pulse of light E.

FIG. 1 is a conceptual representation of a device for generating a magnetic field. The principal active structural element of the magnetic field generator is a conductive ring 1 that forms a closed current path or loop made of materials that support an electron (or hole) plasma. Most metallic materials are suitable, since the electrons in metals generally form a plasma, the associated quasi-particle being referred to as a plasmon. The metallic ring 1 has first and second angular portions 2 and 3 of first and second materials which have first and second Seebeck coefficients which are different. The first and second materials are Au and Ni in the illustrated example. The first and second materials interface at first and second junctions 4 and 5 which are ohmic and are separated angularly in the ring by 90 degrees. The metallic ring is made of a 270° arc of the first material, gold in the example, and 90° arc of the second material, nickel in the example, the ring of the two materials thus forming a thermocouple pair.

A light source (not shown) provides a polarized light beam 6 which is focused by a conventional lens (not shown) onto the ring 1 with the light path being in the z direction. The light constitutes an oscillating electromagnetic field E incident on the ring. Moreover, the light beam is pulsed. The light is of a particular wavelength (or energy) matched to a resonance of electrons (or holes) in the ring, preferably a plasmonic resonance, so that the electrons (or holes) resonantly absorb energy from the light pulses and are thereby heated. Off-resonance absorption can also produce the desired heating, but will need higher light intensities. The light is linearly polarized in the x axis (or the y axis), i.e. aligned with one of the metal junctions 4 (or 5) and perpendicular to the other 5 (or 4), so that the light pulses cause different amounts of transient heating of the electrons (or holes) at the first and second junctions so that one of the junctions becomes hotter than the other. This temperature difference causes a thermally induced transient current to flow around the closed current path from the cold junction to the hot junction, thereby generating a transient magnetic field B. The current flow is indicated by arrows around the ring in the figure which show an anti-clockwise current direction.

In summary, there is provided a Au—Ni ring of nanometer dimensions that can absorb energy in the form of heat from an electromagnetic field E at the wavelength of its plasmonic resonance. A temperature difference is created between the two Au—Ni contacts and produces high magnitude thermal currents allowing the ring to generate a magnetic field pulse or an electromagnetic wave at a lower frequency. The ring thereby acts as a magnetic dipole source. The difference in temperature between the two interfaces gives rise to a built-in electric field according to the Seebeck effect, which imposes a circular current flow around the ring, which in turn excites a magnetic field. The Seebeck effect is the direct conversion of temperature differences to electric voltage and vice versa. A large current pulse can be produced by heating the electrons (or holes) over a timescale which is more rapid than the thermal relaxation time of electrons (or holes) in the host material, which is dictated by the electron-phonon scattering time in the two host materials, which is typically a few picoseconds. The duration of each light pulse is typically of the order of tens to a few hundred picoseconds, which allows the electrons (or holes) to be heated to several thousand degrees Kelvin. The duration of the large current pulse that arises from the hot charge carriers (electrons or holes) is thus limited to a time shorter than the time that the ring takes to reach a thermal equilibrium which is typically of the order of a few picoseconds. By making the pulse shorter than the thermal relaxation time of electrons in relation to the host atoms of the material, the charge carriers can be heated to enhance the thermoelectric effect over what is achievable at thermal equilibrium between the charge carriers and the host lattice. This means that an electromagnetic pulse in the THz range can be emitted, that is radiation of optical period in the range of the thermalization time from the electrons or holes to the atomic lattice.

The principles of operation of the device are now described in more detail by comparing the properties of a ring made of only one material with a two-material ring as described above.

Figures 2A, 2B:
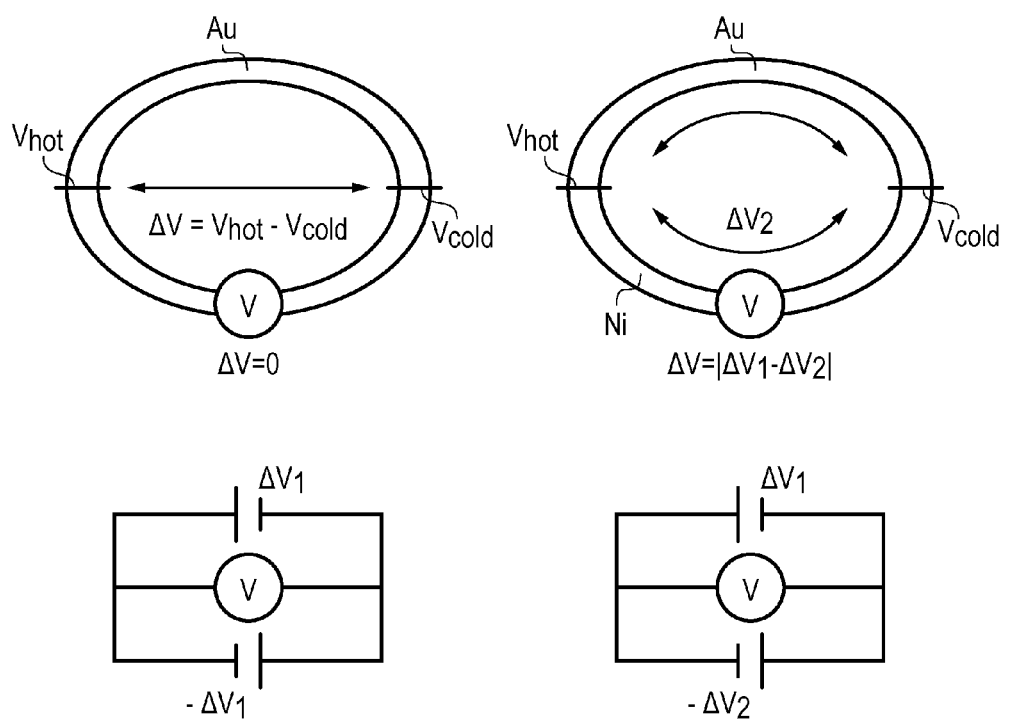
FIG. 2A shows in its upper part a schematic drawing of a Au ring which is hot to the left and cold to the right, and in its lower part and equivalence circuit thereof.
FIG. 2B shows in its upper part a schematic drawing of a ring, the top half of which is Au and the bottom half of which is Ni, wherein the left is hot and the right is cold, and in its lower part and equivalence circuit thereof.

FIG. 2A shows in its upper part a ring made of a single material—shown as Au—which forms a closed current loop. The electric circuit analogue is shown in the lower part of the figure. For the purpose of understanding it is better to think of the loop as being composed of a "bar" of the metal forming the top half and "wires" to a voltmeter forming the bottom half. The left end of the "bar" is heated to a temperature $T_{hot}$ and the right side is cooled to a temperature $T_{cold}$ so that a temperature difference $\Delta T=T_{hot}-T_{cold}$ exists. The higher temperatures at the hot, left part of the "bar" offer electrons more kinetic energy so they start diffusing towards the colder, right end of the "bar". At the end of this process a voltage barrier has built up inside the "bar" that opposes the movement of hot electrons due to electrostatic forces. The potential difference $\Delta V_1=V_{hot}-V_{cold}$ across a piece of metal due to a temperature difference $\Delta T$ is represented through a coefficient called the Seebeck coefficient, expressed as S, which is a function of temperature. So the Seebeck coefficient is defined through the formula: $S=dV/dT$. Therefore the electric field created by a temperature gradient is $$E_{th}=S\nabla T$$

If it is attempted to measure the voltage difference $\Delta V$ created along the "bar" by using the "wires" of the same metal connected to a voltmeter as indicated in FIG. 2A, the same magnitude potential difference $\Delta V_1$ develops across the "wires", opposing that across the "bar". Consequently, no net voltage will be indicated by the voltmeter. A circuit of this kind made of one material therefore cannot act as a voltage source from the Seebeck effect, because the symmetry of the structure means that the same potential difference will exist from both routes between the hot and cold spots eliminating the ability to measure any voltage.

FIG. 2B shows in its upper part a similar situation to FIG. 2A but using two different metallic materials in the loop connected at first and second junctions. The electric circuit analogue is shown in the lower part of the figure. The nominal "bar" is formed of one metal—shown as Au—and the nominal "wires" to the voltmeter are formed of another metal—shown as Ni. This use of two metals is similar to the arrangement of FIG. 1, although the second metal only forms a quarter of the ring in FIG. 1 for reasons that will be explained more fully further below. A region of the ring at the left side is heated and a region on the right side is cooled. The electrons in the hot region are more restless because of their higher energy, leading to greater velocities compared to those in the cold region. Consequently there is a net diffusion of the electrons from the hot end towards the cold end of the gold bar which leaves behind exposed positive metal ions in the hot region and accumulated electrons in the cold region. A voltage difference $\Delta V_1$ is then created along the gold "bar". On the measurement "wires", since these are made of Ni, a different metal, a different magnitude potential difference $\Delta V_2$ develops opposing that across the "bar". A net voltage difference $\Delta V=|\Delta V^1-\Delta V_2|$ then arises. The thermal movement of electrons therefore leads to the creation of a thermal current. With this circuit using two different materials for the "bar" and "wires" that have different Seebeck coefficients, a net voltage can be measured, such a device being called a thermocouple.

This is the operating principle exploited by the magnetic field generator, namely to form a ring of two different materials and induce a net current to flow around the ring.

Results for a specific example of a Au—Ni ring and a control example of a pure Au ring, which is of otherwise identical structure and dimensions, are now discussed.

The ring is circular and has an inner diameter of 50 nm, an outer diameter of 150 nm so the radial thickness of the ring is 50 nm. The thickness of the ring, i.e. its thickness perpendicular to the plane of the ring, is also 50 nm The Au—Ni ring has a 270° arc of Au and a 90° arc of Ni.

The ring is embedded in a silica host, silica having a refractive index n=1.45. The surface plasmon (sometimes called surface plasmon polariton) dipole resonance is at $\lambda$=940 nm for the Au ring and $\lambda$=920 nm for the Au—Ni ring. The light pulses are polarized in the x direction. The light pulses have a duration of 100 fs and a repetition rate of 100 MHz. The spot diameter of the focus is 1 µm giving an intensity of 10 GW/cm$^2$ from an optical pulse energy of 8 pJ. The average power is therefore less than 1 mW.

Figure 3A:
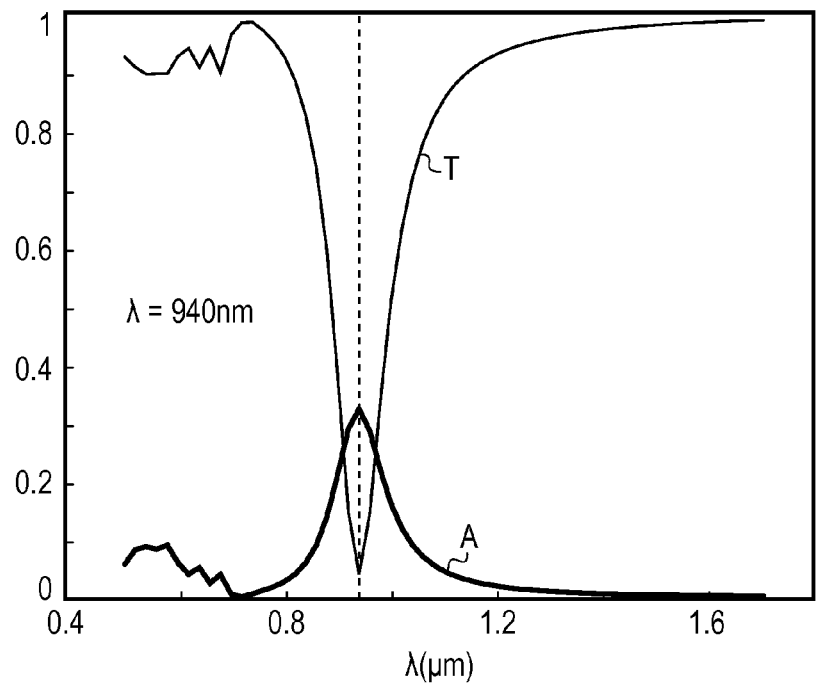
FIG. 3A is a graph showing absorption A and transmission T as a function of wavelength $\lambda$ for a Au ring as shown in FIG. 2A.

FIG. 3A is a graph showing the distribution of the electric field and the Joule losses of the control example single material Au ring for the plane passing through the middle of the ring. The graph shows the transmission spectrum T and the absorption spectrum A as a function of wavelength in the region of the resonance.

Figure 3B:
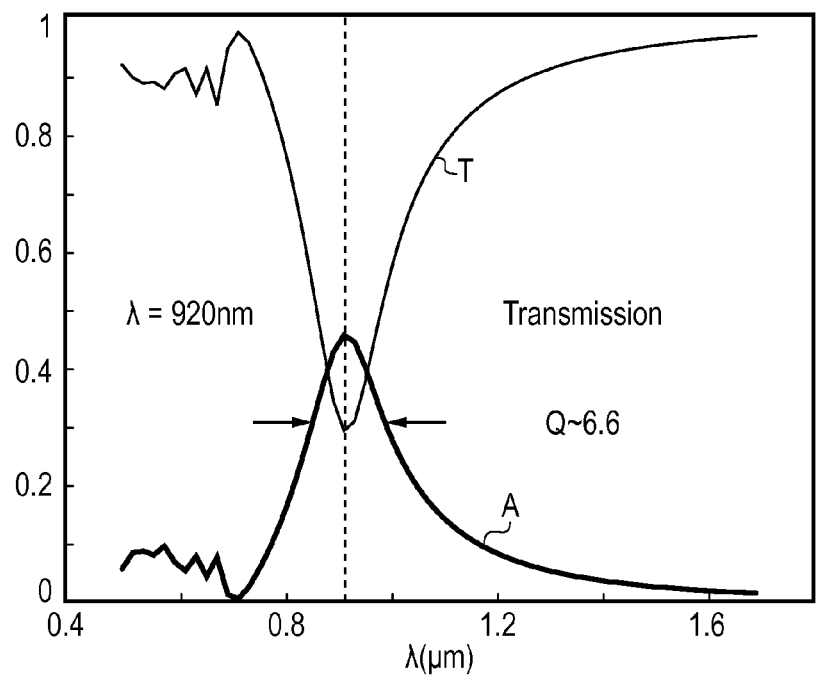
FIG. 3B is a graph showing absorption A and transmission T as a function of wavelength $\lambda$ for the example Au—Ni ring of FIG. 1 and as shown in FIG. 2B.

FIG. 3B is a graph showing the distribution of the electric field and the Joule losses of the specific example two material Au—Ni ring for the plane passing through the middle of the ring. The graph shows the transmission spectrum T and the absorption spectrum A as a function of wavelength in the region of the resonance. It can be seen that the resonance is broadened compared with the pure Au ring due to the increased losses of Ni.

This resonance corresponds to two fundamental surface plasmon polariton $\lambda_{SPP}/2$ modes appearing across the semicircles created by the diameter parallel to the polarization of the field. At this resonance the ring starts absorbing energy from the external field, which transforms into scattered field (radiation losses) and Joule losses. Since the E field is maximum, at a specific time instance, in the sections of the ring that intersect with the direction of polarization with the field, maximum ohmic losses occur in between these two areas where the maximum currents exist, assuming that the resistance of the ring is uniform. These areas where maximum Joule losses take place, creating resistive heating, act as the source for a temperature gradient, which is necessary for the Seebeck effect to take place.

Due to the symmetry of the structure of the control example of the Au ring, it will not be able to create a current loop. The situation is similar to placing two voltage sources with opposite polarity in a series circuit.

On the other hand, with the specific example using the two different metals, when the bimetal junctions are at different temperatures, a net electromotive force will appear in the ring capable of inducing currents. In order to achieve this, and having in mind that one of the junctions is best placed at a position where the heating is maximum, the second interface should be where the heating is minimum. Such a condition for a plasmonic nano-ring appears to be satisfied 90° away from the maximum ohmic dissipation point. At that point charges are maximum, while currents are minimum. This is the reason for the design of the specific example of bimetallic ring with 270° arc made of Au and the remaining 90° quadrant of Ni. The 90° angular separation between the two junctions is the optimum with deviations away from this being expected to gradually reduce the temperature difference and hence the magnitude of the generated magnetic field.

Various design factors need to be considered in the choice of the first and second metals A and B.

The first metal should support a strong low loss surface plasmon. Gold is an ideal candidate, hence its use in the specific example.

The first and second metals should be easy to handle in nanofabrication from a processing point of view.

The second metal should not affect too much the plasmonic properties of the first metal, so that the composite ring acts as a single plasmonic dipole resonator.

The second metal should be a good thermoelectric pair with the first metal, i.e. have a significantly different Seebeck coefficient, since the effective potential difference created in the ring will be proportional to the difference between the respective Seebeck coefficients:

$$V_{AB} = \int_{T_0}^{T} (S_A - S_B) dT$$

Use of Au for the first material and Ni for the second material fulfills all the above factors well.

Referring to FIG. 3B, the 920 nm plasmonic resonance of the Au—Ni ring embedded in silica has a quality factor Q=6.6, which is high enough to allow the ring to act very well as a transformer of optical energy into thermal loop current. The thermally induced current breaks the symmetry of the device, which now appears to have enhanced resistive heating, only at the side where the Au—Ni junction exists. This happens because the losses of Ni expressed through its relative permittivity ($\epsilon_r = -15.45 \pm i25.6$ at 920 nm) are much higher than for Au ($\epsilon_r = -34.5 \pm i2.1357$) forcing maximum currents to provoke higher Joule losses at that interface, compared to the all-Au side.

The source for the temperature gradient will be the Joule losses dissipated in the ring. An increase in joule losses will act as a stronger heat source resulting in higher temperature gradients. To achieve that, excitation by a CW laser is not optimum and a pulsed laser has to be used. If we consider using a femtosecond laser source with 100 fs pulses and average intensity of $I=10^{14}$ W/m$^2$, so that we have intense short light pulses, the temperature gradient is entirely placed in the electron gas temperature, which takes a few picoseconds to thermalize to phonons. So what actually happens is that the enhanced absorption of energy of the ring is depositing the energy of the optical wave on the surface electrons, and this energy is transported by the electrons and finally transferred from the electrons to the lattice. A widely accepted and developed model to predict this heat transfer process is the two-temperature model. Following this model, the temperatures of electrons and lattice are calculated separately and coupled by a term proportional to the temperature difference between electrons and lattice. The energy equations of the free electrons and lattice are:

$$C_e \frac{\partial T_e}{\partial t} = \nabla(k_e \nabla T_e) - G(T_e - T_l) + S$$

$$C_l \frac{\partial T_l}{\partial t} = \nabla(k_l \nabla T_l) + G(T_e - T_l)$$

where C is the heat capacity, T is the temperature, k is the thermal conductivity, G is the coupling coefficient between electrons and the lattice and S is the heat source, related to the absorption spatial map of the structure. The subscripts e and l refer to the electrons and lattice, respectively. All of these parameters are functions of temperature, both for Au and Ni, which makes the estimate of transient temperature in the structure a strongly nonlinear problem. In order to proceed with the transient estimation it is necessary to estimate the thermal parameters as a function of temperature both for the Au part and for the Ni part of the ring. The electronic scattering rates in metals after pulsed laser heating with pulses of duration less than the electron-phonon scattering time can be drastically different from those predicted using free electron theory. The large electron temperature achieved after pulsed absorption and subsequent thermalization can lead to excitations of electrons far below the Fermi energy. This means that we have to account for these effects into the estimation of the two-model coefficients. Using a finite-element-method numerical solver, the temperatures of the electrons and the lattice have been calculated as a function of time and space for the specific example Au—Ni nano-ring.

Figure 4:
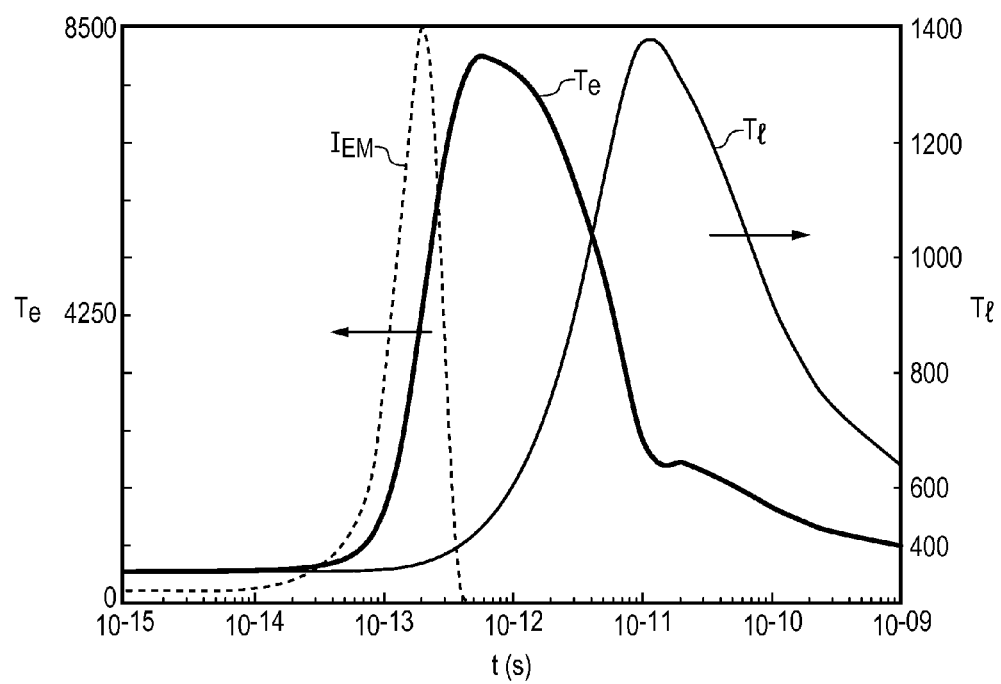
FIG. 4 is a graph of electron temperature $T_e$ (left hand y-axis) and lattice temperature $T_l$ (right-hand y-axis) as a function of time t in response to application of an electromagnetic pulse of intensity profile $I_{EM}$ for the example Au—Ni ring of FIG. 1 and as shown in FIG. 2B; it being noted that time is on a logarithmic scale.

FIG. 4 is a graph showing the results of these calculations. Ni electron temperature (left-hand y axis) and Ni lattice temperature (right hand y axis) are plotted at different time instances after heating by the excitation electromagnetic pulse $I_{EM}$ of wavelength $\lambda=920$ nm and duration 100 fs. The center of the light beam is arranged to pass through the middle of the ring. The light pulse intensity $I_{EM}$ is plotted in arbitrary units with the dashed line. It is noted that time along the x axis is plotted on a logarithmic scale. A wavelength of $\lambda=920$ nm is associated with an oscillation period of the electromagnetic field of about 3 fs. With the plasmon resonance quality factor Q=6.6 this means that it takes about 20 fs for the ring resonator to reach a steady state vis-à-vis the electron heating. The temperature of electrons rises up to 8260 K for Ni, while the lattice's temperature remains practically the same for the first hundreds of femtoseconds. The situation changes after a few picoseconds as the electrons start cooling down through electron-phonon interaction and the lattice temperature increases up to 1365K for Ni (and 600K for Au which is not shown in the graph), before returning to approximately 600K. At longer times from the light pulse, the energy starts to diffuse into the silica substrate without melting the metallic nanostructure.

As mentioned above, the temperatures of the electrons and the lattice have been calculated as a function of space and time over the area of the ring. These spatial results show how the electron temperature hot spot builds up at the Au—Ni junction at the part of the ring orthogonal to the direction of polarization of the light, reaching 8260K after 310 fs, whereas the coldest part of the ring has an electron temperature of 2470K at this time. Around this time, heat starts transferring from the electrons to the lattice, but the peak lattice temperature is only 336K at 310 fs and the minimum lattice temperature, which exists over almost all of the Au part of the ring, is still unchanged at room temperature, i.e. 273K.

Much later, 200 ps after the light pulse, there is relatively little difference any more in electron temperature around the ring (maximum 687K and minimum 620K), so the current has largely reduced to an insignificant fraction of its peak value. At the same time, the lattice temperature has risen to a maximum of 730K which extends around the Ni part of the ring, whereas still no elevation in temperature has occurred in the Au part of the ring farther away from the Ni segment.

Such a high peak transient temperature of the electrons of the order of 10,000K gives rise to a huge temperature gradient between the two bimetallic junctions. In addition, under these conditions of strong electron-phonon non-equilibrium, we find that the Seebeck coefficient is massively enhanced, because of excitation of d band electrons. We find that the Seebeck coefficient can increase by more than two orders of magnitude at electron temperatures around 10,000K. In other words, not only does the high electron temperature increase the Seebeck effect in a linear way by increasing the temperature difference between hot and cold junctions in the ring, but it also increases the Seebeck coefficient itself. The thermoelectric effect is therefore huge owing to the combination of these two factors.

Having conducted this analysis, we are now in a position to calculate the induced thermal currents as a result of the thermoelectric effect in the closed bimetallic loop. The current at each specific point can be estimated through the simple expression:

$$j_{th} = \sigma(T)S(T)\nabla T$$

where $\sigma(T)$ is the conductivity, and $S(T)$ is the Seebeck coefficient as a function of temperature.

Figure 5:
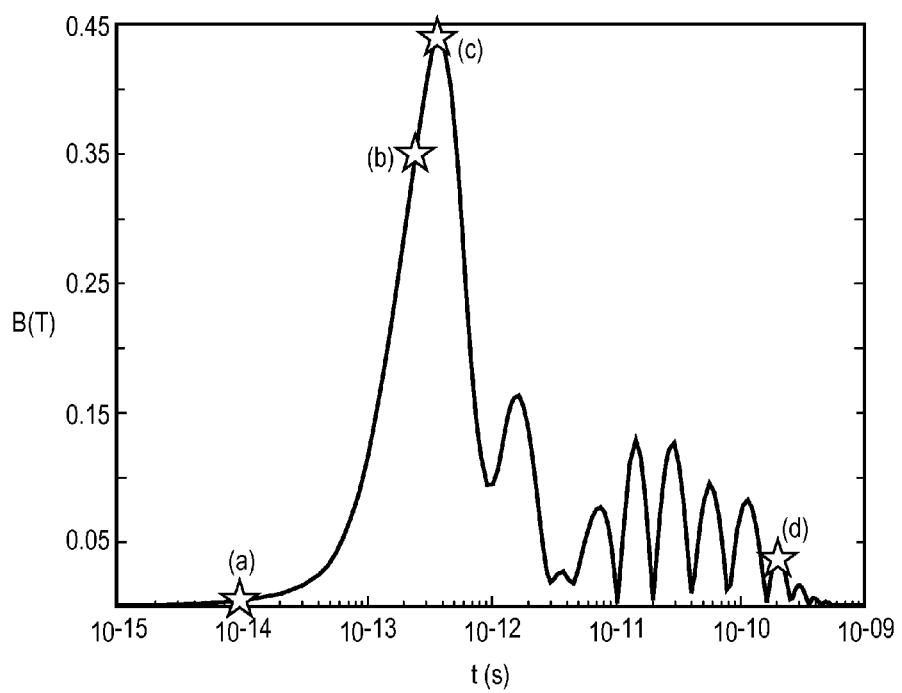
FIG. 5 is a graph of the magnetic field B in Tesla T as a function of time in response to application of an electromagnetic pulse of intensity profile $I_{EM}$ for the same parameters and example as FIG. 4; it being noted that time is on a logarithmic scale.

FIG. 5 is a graph plotting the magnetic flux B in Tesla T as a function of time t in seconds s at the center of the ring. The time scale is logarithmic. Points (a), (b), (c) and (d) on the curve at times 10 fs, 310 fs, 410 fs and 0.2 ns are marked with stars. At t=10 fs (point (a)), very little current has built up, so the magnetic field is very small at around 10 mT, but nevertheless it exists owing to the clockwise current flow around the ring. At t=310 fs (point (b)), when the electron temperature has reached its peak (see FIG. 4), the magnetic field is extremely large having a value of 0.35 T. However, the peak magnetic field is not reached at this point in time, but is reached 100 fs later at t=410 fs (point (c)), having a value of 0.44 T. Much later, at t=0.2 ns, when the absolute electron temperatures are significantly reduced, and the relative electron temperature difference between the two junctions has also become small (see above discussion of FIG. 4), the magnetic field has dropped to a small value around 30 mT. It is noted the magnetic field values are referred to the center of the ring.

As described above, these thermal currents will cause charges to move and concentrate at specific positions that will indicate that the electrostatic forces between these charges need to be taken into account, since they will influence the total current distribution. Electrostatic effects cannot be omitted since they appear on a time scale of the order of $10^{-18}$ s. A simple way to account for these effects is by considering that the diffusion of the total-current density is equal to the rate that the charge density changes, which is simply introduced by the continuity equation $$\nabla \vec{j} = -\frac{\partial \rho}{\partial t}$$

Following this analysis, we can clearly observe that we have strong transient currents flowing in the nano-ring, able to induce a magnetic field. The ring will emit a strong magnetic pulse of peak amplitude of approximately 0.5 T and duration ~200 ps. The time duration of the pulse is related to the thermalization time of the electrons. Once the thermal energy of the electrons passes to phonons, resulting in a temperature increase of the lattice, the thermoelectric effect is much smaller, because both the temperature gradient is much smaller (almost uniform temperature across the ring) and the Seebeck coefficient is much smaller. The current densities then have much smaller magnitudes that are only able to sustain a magnetic field in the milli-Tesla range or below. Only the area around the Au—Ni high temperature junction appears to have a remaining high temperature gradient that leads to subsequent magnetic pulse excitations. Since the thermalization time is in the range of hundreds of picoseconds, the frequency of the field lies in the THz range. This means that the dimensions of the nano-ring are much smaller than the emitted wavelength (D<<λ), which indicates that the nano-ring behaves as a magnetic dipole source. At these frequencies, the self-inductance effects are much smaller than the resistance for this geometry of the structure, which we can safely neglect.

We have shown that a bimetallic nano-ring made of Au—Ni can act as a transformer of optical wave energy from a near infra-red (NIR) externally supplied illumination to a THz source of strong magnetic pulses. The magnetic pulses have an extremely large magnitude in a very small volume. In particular, a magnetic pulse having an amplitude of the order of a Tesla can be produced which is concentrated in an area of the order of 70 nm. The magnitude and localization of such magnetic sources is ideally suited to magnetic recording technology. The specific example shown is capable of achieving areal densities of data storage of 100 gigabits per square inch. In principle, these structures can be shrunk down to fabrication limits, which with current fabrication technology would allow data storage to reach densities up to 0.5 terabits per square inch. Furthermore, such a structure can be used for magnetic spectroscopic techniques. The structures can also be used simply as a THz radiator, for which different emitted frequencies could be achieved by controlling the thermalization time through fabrication and light-incidence conditions.

It will be understood that various different metal combinations can be used for the ring. Some suitable metals are listed below with known values of Seebeck coefficient S and Fermi level $E_F$.

TABLE

Seebeck coefficients and Fermi energies of selected metals (from various sources)

| Metal | S at 0° C. (μ V K$^{-1}$) | S at 27° C. (μ V K$^{-1}$) | $E_F$ (eV) | x |
|---|---|---|---|---|
| Na |  | −5 | 3.1 | 2.2 |
| K |  | −12.5 | 2.0 | 3.8 |
| Al | −1.6 | −1.8 | 11.6 | 2.78 |
| Mg | −1.3 |  | 7.1 | 1.38 |
| Pb | −1.15 | −1.3 |  |  |
| Pd | −9.00 | −9.99 |  |  |
| Pt | −4.45 | −5.28 |  |  |
| Mo | +4.71 | +5.57 |  |  |
| Li | +14 |  | 4.7 | −9.7 |
| Cu | +1.70 | +1.84 | 7.0 | −1.79 |
| Ag | +1.38 | +1.51 | 5.5 | −1.14 |
| Au | +1.79 | +1.94 | 5.5 | −1.48 |
| Zu |  |  | 9.4 |  |
| Ni | −15 |  | 5.4 |  |

The column with x shows the correction factors for different metals.

The metals may be pure or alloys. It may also be possible to make structures with more than two metals.

In summary, a metamaterial ring structure made of two different metals is provided, such as gold and nickel. Utilizing the thermoelectric properties of two metallic materials arranged in a suitable closed current path allows the manufacture of magnetic sources of high field strength and short duration of the magnetic fields. Such thermoelectric metamaterials act as transformers of high frequency optical energy into long duration THz radiation pulses. Applications of these devices range from magnetic recording to magnetic field spectroscopy techniques and efficient THz sources.

The thermoelectric effect is thus exploited to generate magnetic fields in a device comprising a light source operable to generate pulses of light of a particular wavelength and having an oscillating electromagnetic field with a defined polarization. A field generator is arranged to receive the light and is made of a metallic closed loop having first and second angular portions of first and second metallic materials interconnected by first and second junctions. The first and second materials have different first and second Seebeck coefficients. The closed loop has a plasmonic resonance of electrons at an energy matched to the wavelength of the light source, so that in use the electrons resonantly absorb energy from each pulse of light and are thereby transiently heated. The polarization of the light is aligned relative to the closed loop so that each pulse of light causes different amounts of transient heating of the electrons at the first and second junctions and one of the junctions becomes hotter than the other, which causes a thermally induced transient current to flow around the closed loop from the cold junction to the hot junction, thereby generating a transient magnetic field.

In brief, a magnetic field generating device is provided by a conductive ring made up of a least two sections that are made of different conductors. The ring is illuminated with light. The light stimulates an oscillating current of free electrons in the ring. The current has inhomogeneous distribution around the ring. As a result, one of the junctions between different conductors is exposed to a different level of stimulation than the other junction. A high level of excitation and a large difference between excitation of the two junctions can be achieved when the ring acts as a resonant absorber of optical radiation. In response to the resonant absorption, the lattice and electron temperature at the junction areas will grow differently. The ring will act as a thermocouple (the Seebeck effect). The Seebeck effect will lead to a unidirectional current in the ring. The thermocouple current will not oscillate at the light frequency, but its magnitude will depend on the electron and lattice temperatures at the two junctions. The induced current will be particularly strong if a short optical pulse is used to illuminate the ring leading to a strong transient increase of electron temperature at one of the junctions. Current will change with time much more slowly than the oscillating optical field. Current will generate a magnetic field that concentrates inside the ring. This magnetic field will change much more slowly than the oscillating optical field.

Figure 6:
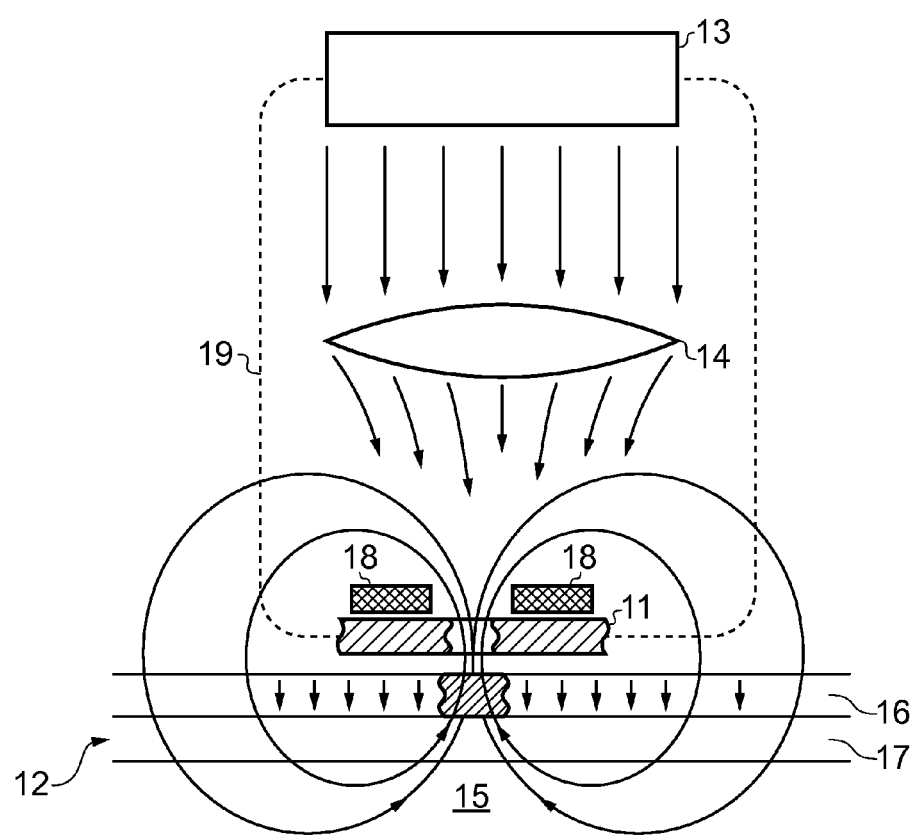
FIG. 6 is a schematic drawing of a magnetic recording head incorporating a ring magnetic field generator device according to FIG. 1.

FIG. 6 shows a magnetic generator according to the specific example being used as part of a magnetic recording head. The head comprises a pulsed light source 13, a focusing lens 14 and a magnetic field generating device in the form of a conductive ring 11. The magnetic recording head may be enclosed in a magnetic shield 19. The light source 13 and lens 14 are arranged to focus the light onto the ring 11 and generate a magnetic field 15, which is highly concentrated in the vicinity of the ring. A magnetic recording medium 12 is shown which is arranged directly underneath the ring 11. The medium comprises an upper magnetic recording layer 16 and optionally a substrate layer 17, which may be non-magnetic (as inferred in the drawing by the magnetic field pattern which is not modulated by the substrate layer 17) or may be a soft magnetic material as in PMR devices. A cooling element 18, such as a supply of a cryogenic liquid or gas, is also shown. The cooling element 18 is arranged in thermal connection with the ring 11. In use, the cooling element 18 lowers the temperature of the ring to a temperature at which it is superconducting. The overall resistance of the current path is thereby reduced and the strength of the magnetic field increased. Adjacent perpendicular (i.e. vertically aligned) magnetic domains in the recording layer 16 are shown schematically with vertical arrows. Activation of the head by a light pulse, or a burst of light pulses, would then cause the domain directly under the ring to align in the preferred orientation, thereby encoding a bit of data. The nano-ring magnetic field generator according to the specific example would replace a conventional "monopole" element.

It is noted that the light might also have the effect of locally heating the magnetic recording medium to provide heat assisted magnetic recording (HAMR). As evident from the figure, since the ring 11 is by definition above the magnetic domain to be written to and since the incident light is directed onto the ring 11 perpendicular to the planes of the disk 12 and ring 11, the central hole in the ring 11 effectively acts as a mask to self align a light spot onto the disk 12 precisely at the area being written to. Even if a different light source is used to provide the HAMR effect, it may nevertheless be most convenient to route the HAMR light through the same focusing optics as the plasmon resonating light so that the nano-ring can provide a self-aligning mask function. Alternatively, an entirely separate conventional local heating element could be provided if HAMR is to be used. (An equivalent system could also be provided with longitudinally aligned magnetic domains, i.e. magnetic domains lying in the plane of the recording medium. The ring structure 11 would then be aligned with the plane of the ring being perpendicular to the plane of the recording medium. The nano-ring magnetic field generator according to the specific example would replace a conventional "ring" element.)

Figure 7:
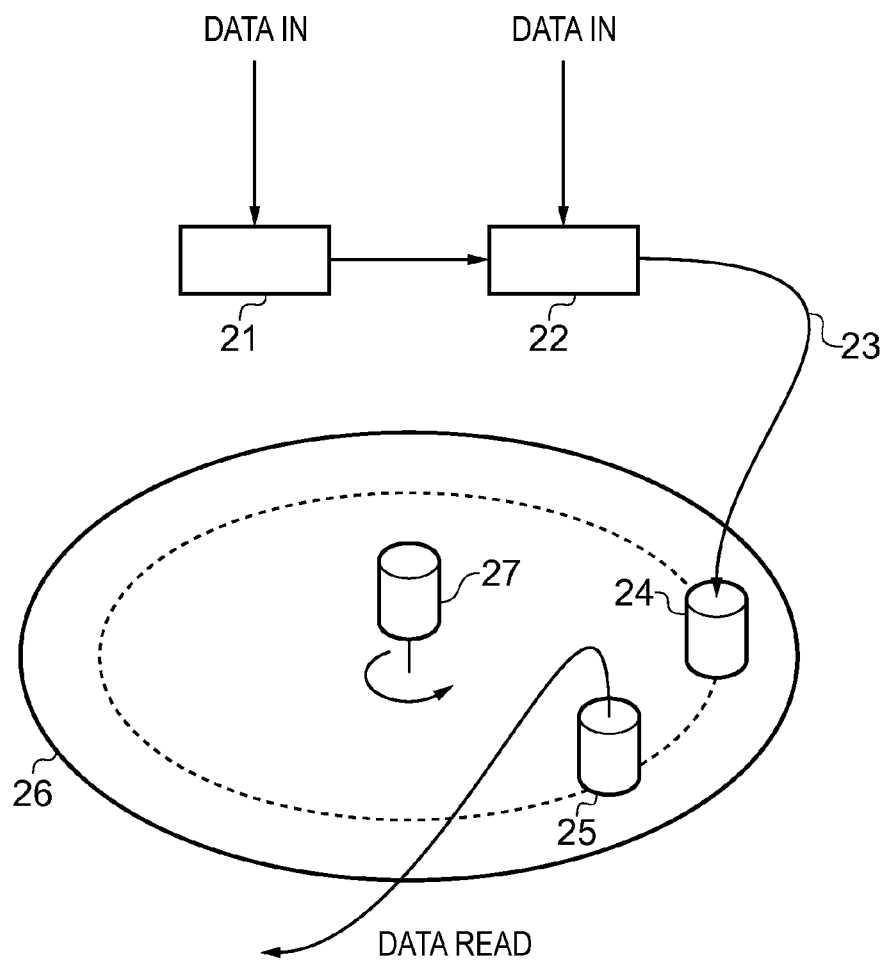
FIG. 7 shows schematically the magnetic recording head of FIG. 6 incorporated in a magnetic disc drive system.

FIG. 7 shows a higher level system drawing of a magnetic recording application. A magnetic data recording apparatus contains a laser 21 or other light source such as a semiconductor diode, followed by an optional optical modulator 22, and a light waveguiding tract 3, for example an optical fiber which may be multimode or single mode matched to the light source. The waveguide 23 terminates at a magnetic recording head 24 as described in FIG. 6, arranged above the magnetic disk 26. An optional magnetic reading head 25 is also arranged above the magnetic disk 26 as illustrated by DATA READ. The disk 26 is rotatably driven by a disk drive motor 27. An incoming data signal DATA IN bearing data to record on the disk is used to modulate the laser 21 and/or modulator 22 so that the relevant bits are written to the magnetic disk by the magnetic recording head 23. The reading head 25 may be used during recording to check the data is correctly recorded, or later to read the data on demand.

Figure 8:
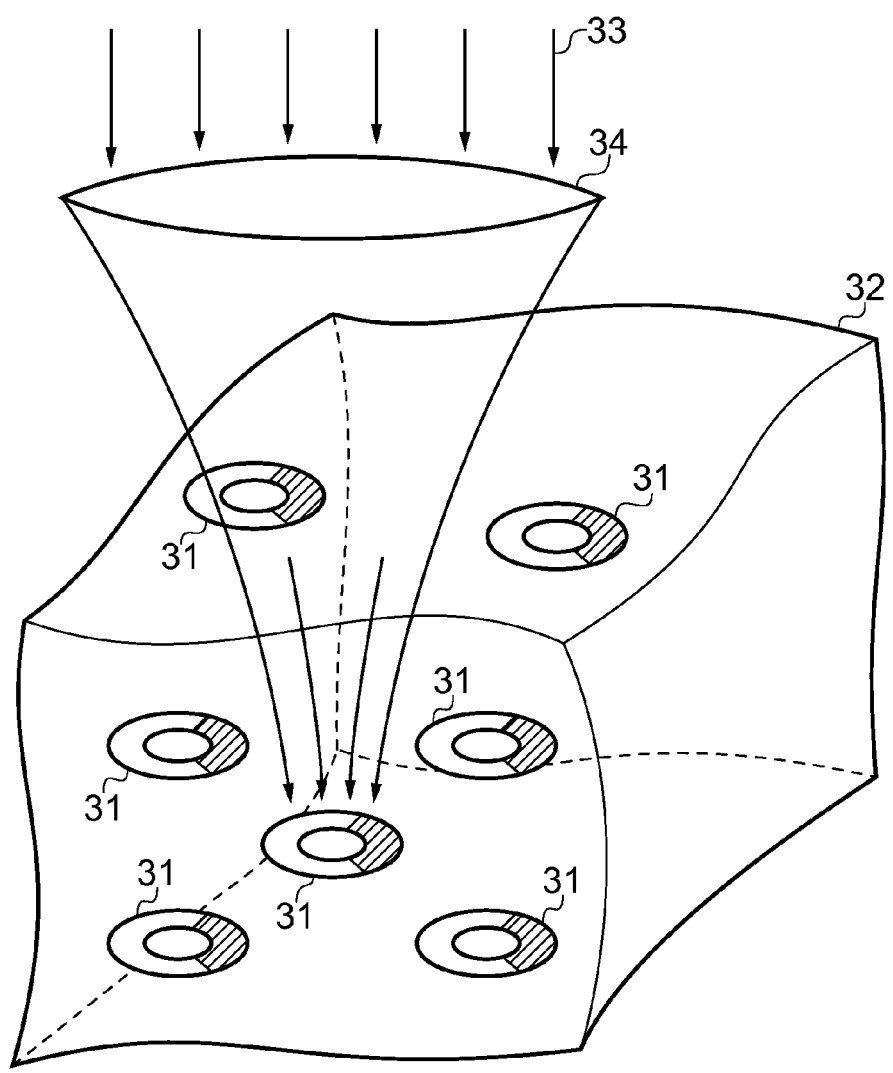
FIG. 8 is a schematic perspective view of a volumetric magnetic memory incorporating multiple ring magnetic field generator devices according to FIG. 1.

FIG. 8 is a schematic perspective view of an example in which a three-dimensional volumetric magnetic memory may be controlled by embedded nano-ring structures according the specific example. A number of magnetic field generating devices 31 are embedded inside a magnetic material 32. The magnetic material 32 is transparent for light 33 which is required to generate a magnetic field by the magnetic field generating devices 31. A selected embedded magnetic ring 31 is stimulated by focusing the light 33 with a lens 34 leading to a change in magnetization in the vicinity of the selected ring 31 thus writing magnetic information in a three-dimensional storage volume.

Figure 9:
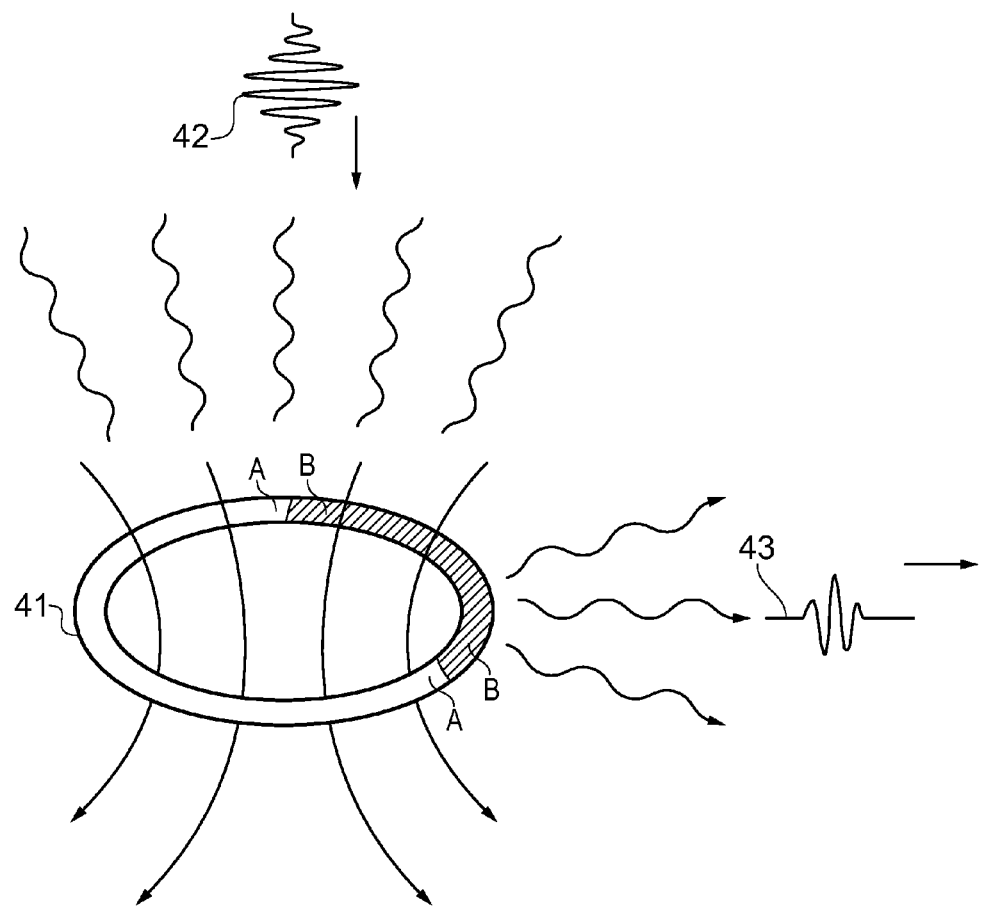
FIG. 9 is a schematic perspective view of a terahertz or millimeter-wave radiation source incorporating a ring magnetic field generator device according to FIG. 1.

FIG. 9 is a schematic perspective view of a terahertz or millimeter-wave radiation source. A nano-ring 41 of materials A and B is illuminated with a pulse 42 of optical radiation in the visible or infrared parts of the electromagnetic spectrum. The nano-ring in response generates a burst of terahertz or millimeter-wave radiation 43.

Figure 10:
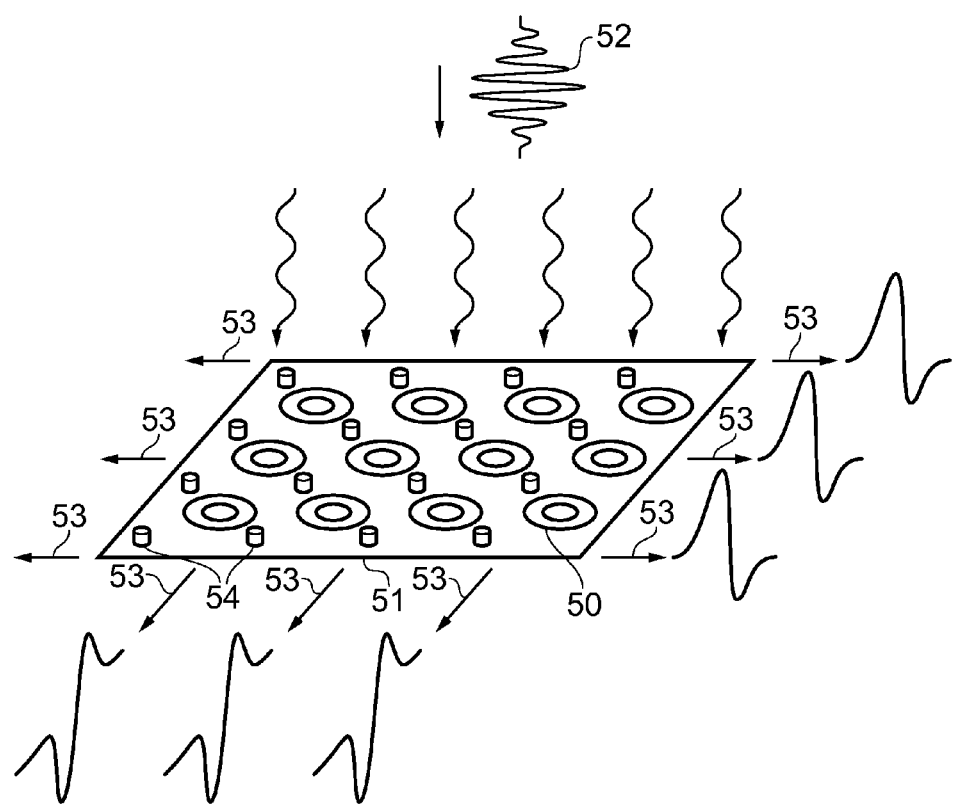
FIG. 10 is a schematic perspective view of another terahertz or millimeter-wave radiation source incorporating multiple ring magnetic field generator devices according to FIG. 1.

FIG. 10 is a schematic perspective view of another terahertz or millimeter-wave radiation source. An array 50 of magnetic field generating devices is provided on or in a planar substrate 51, for example quartz. The nano-rings are subject to simultaneous blanket illumination with a pulse 52 of optical radiation in the visible or infrared parts of the spectrum. The array of nano-rings 50 in response generates a burst of terahertz or millimeter-wave radiation 53. Cylindrical pillars 54 are also arranged protruding from the substrate 51 in between adjacent nano-rings 50. The pillars 54 constitute a heat dissipation structure to assist removal of heat generated by the current induced in the nano-rings. The pillars are arranged in between the nano-rings so they do not interfere with the optical coupling between the nano-rings and the incident light pulses.

Figure 11:
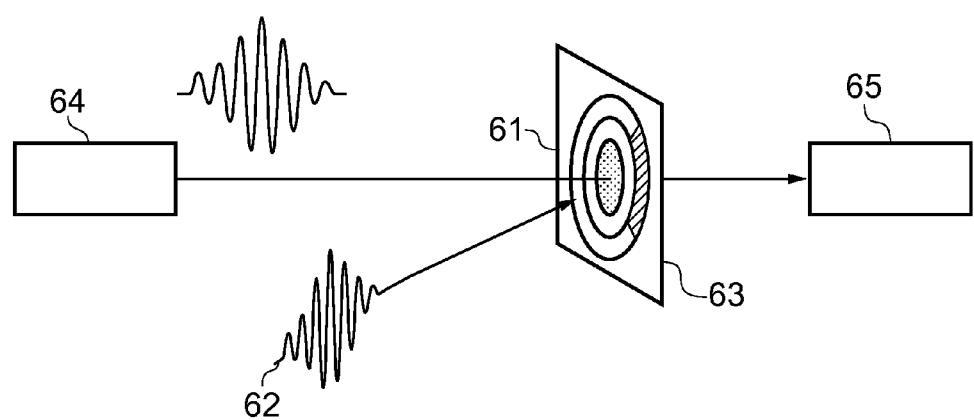
FIG. 11 is a schematic perspective view of a diagnostic apparatus for studying transient magnetic properties of a sample.

FIG. 11 is a schematic perspective view of a diagnostic apparatus for studying transient magnetic properties of a sample. A nano-ring magnetic field generating device 61 is arranged adjacent a sample 63 to be studied. The nano-ring is illuminated with optical or infrared pulse 62 to create a pulsed magnetic field that penetrates the sample 63. The sample 63 is at the same time probed by another pulsed light source 64, wherein the probe light is detecting with a sensor 65. The sensor 65 is configured to measure changes in a relevant property of the probe light, such as intensity or polarization state, in order to measure changes induced in the sample by the magnetic pulse.

Figure 12:
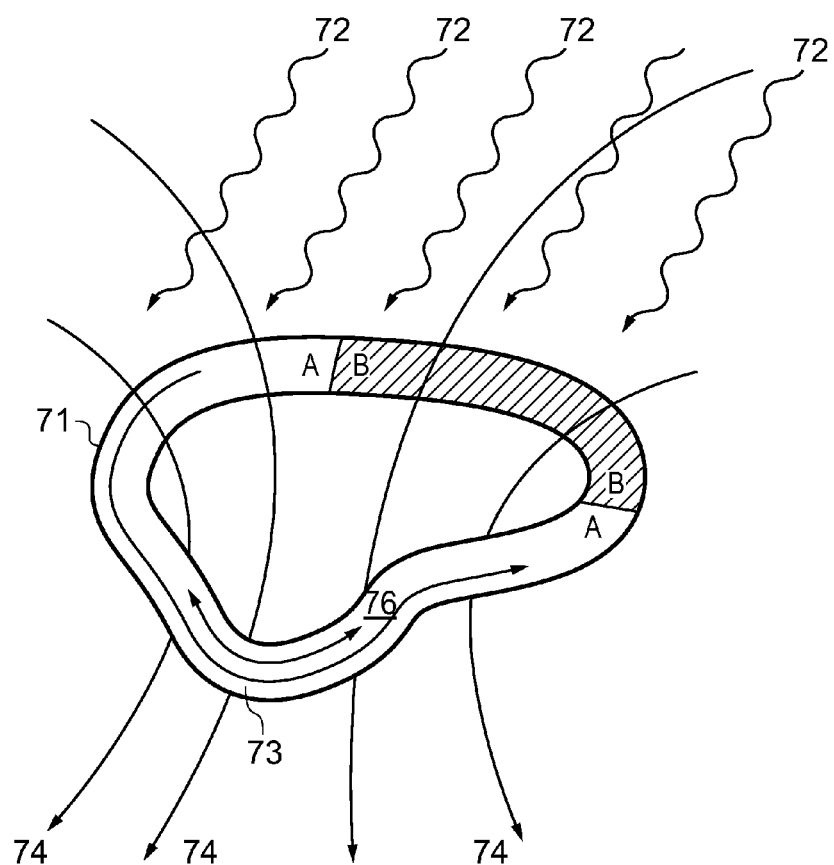
FIG. 12 shows a variant loop shape in which the closed current path is formed by first and second incomplete rings and of different diameter.

FIG. 12 is a schematic perspective view of an alternative ring shape. In the above-described examples, the ring has been circular. Through the above description of the underlying effect being exploited, it will also be understood that an arbitrary closed loop shape will also produce the desired magnetic field inducing net current. FIG. 12 shows a variant shape in which the closed current path formed by materials A and B is formed by first and second incomplete rings 71 and 73 of different diameter joined together such that the interiors of the incomplete rings form connected spaces. One of the incomplete rings 71 (or 73) is dimensioned to optimize the resonance with the oscillating electromagnetic field of the incident light 72 and the other of the incomplete rings 73 (or 71) is dimensioned to optimize the transient magnetic field 74, for example in terms of its magnitude and/or extent.

Figure 13:
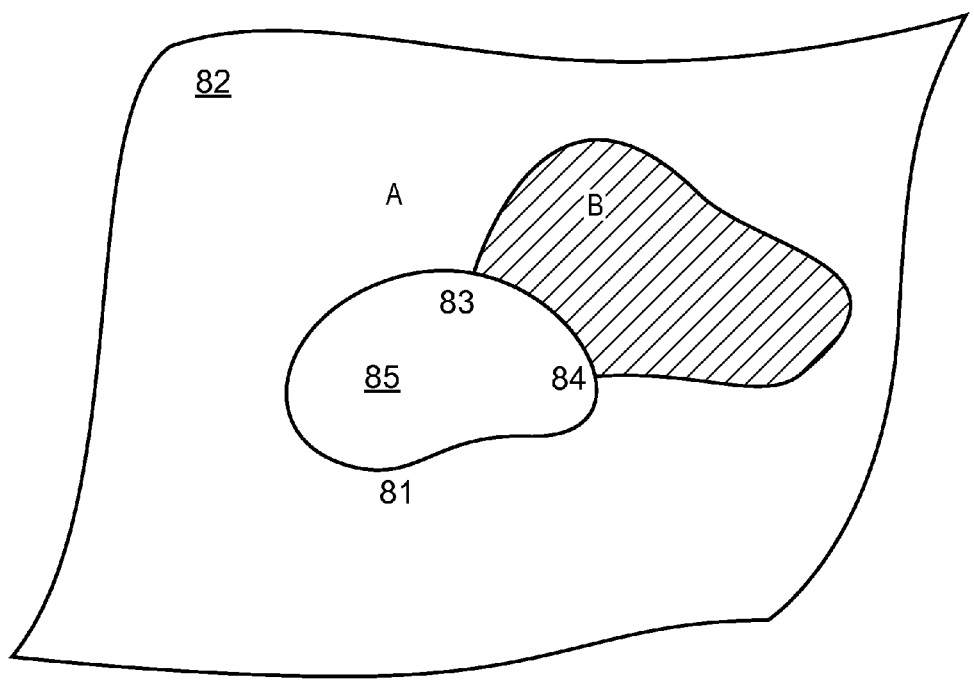
FIG. 13 shows a fabrication variant of the bi-metallic structure.

FIG. 13 shows a fabrication variant of the bi-metallic structure of the principal example. Instead of a ring, the current path is created from a metallic sheet 82 by cutting a hole 85 in the sheet. The sheet 82 is predominantly composed of a first metal A, but also has an area of a second metal B. The hole is positioned so that a lesser portion of the rim of the hole is formed by the second metal B, the remaining part of the rim being formed by the first metal A. An effective current path crossing both materials and involving inter-metallic junctions 83 and 84 is still formed in such a structure because the current path around the portion of the rim 81 composed of the first metal A between the junctions 83 and 84 is shorter than the electrically parallel current path which flows solely in the first material avoiding the second material. This fabrication approach is also suitable for making a planar array of magnetic field generating structures. Alternatively, a ring can be patterned by removing a groove at a certain distance along the perimeter of the hole.

Additionally, some of the elements involved in the above structures can be operated a low enough temperatures so that they behave as superconductors. Specifically, the longer parts of the ring which contribute to create electrical resistance, but are less involved in the thermalization process described above, can be cooled in order to decrease the electrical resistance of the loop, thus increasing the resulting current and producing more intense magnetic fields.

Analogous structures to those described above that exploit the thermoelectric effect can also be fabricated which exploit other physical effects.

Figure 14:
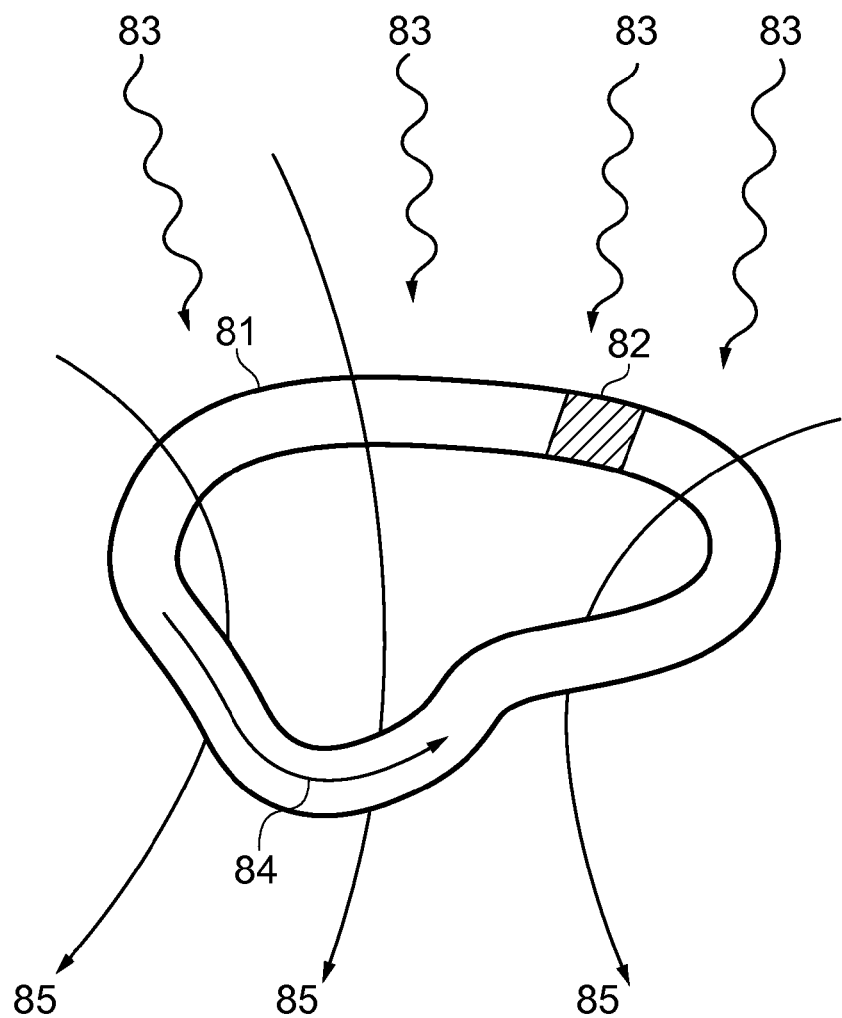
FIG. 14 shows an example ring structure of non-thermoelectric examples.

FIG. 14 shows an example ring structure 81 which is not based on the thermoelectric effect. In one variant, the ring is made of a semiconductor which exploits a p-n junction 82. Incident light 83 stimulates a photovoltaic effect in the junction 82 leading to a unidirectional current 84 in the ring. The resonance is thus between a valence band and a conduction band of the semiconductor. Current 84 will change with time much more slowly than the oscillating optical field. Current 84 will generate magnetic field 85 that is concentrated inside the ring. This magnetic field will change much more slowly than the oscillating optical field. The same figure may also be considered to show another variant based on a metal-insulator-metal tunnel junction in place of the p-n junction. Namely, an example ring structure which exploits electron tunneling across a metal-insulator-metal tunnel junction 82 formed in a metal ring 81. Incident light 83 provides an oscillating electric field to induce current flow 84 around the ring 81 which in turn induces a magnetic field 85. The metal-insulator-metal tunnel junction is formed by an insulator interposed between the metal. The current 84 around the ring 81 is driven by the light 83 inducing asymmetric electron tunneling through the junction 82.

What is claimed is:

1. A device for generating a magnetic field, comprising:
   a light source operable to generate pulses of light of a particular wavelength, the light having an oscillating electromagnetic field with a defined polarization; and
   a magnetic field generator arranged to receive the light and comprising a closed current path made of first and second angular arc portions of first and second materials interconnected by first and second junctions;
   the closed current path comprising electrons or holes which absorb energy from each pulse of light and are thereby transiently heated; and
   the polarization of the light being aligned relative to the closed current path so that each pulse of light causes different amounts of transient heating of the electrons or holes at the first and second junctions so that one of the junctions becomes hotter than the other, which causes a thermally induced transient current to flow around the closed current path, thereby generating a transient magnetic field.

2. The device of claim 1, wherein the first and second materials are metallic and have first and second Seebeck coefficients which are different and the first and second junctions are ohmic, and wherein the light is absorbed by a plasmon.

3. The device of claim 2, wherein the first and second junctions are separated angularly by approximately 90 degrees, wherein approximately indicates a range of one of ±45 degrees.

4. The device of claim 1, wherein the first and second materials are semiconductors and the first and/or second junctions are p-n junctions, and wherein the resonance is between a valence band and a conduction band of at least one of the semiconductors.

5. The device of claim 1, wherein the first and second materials are metallic and the first and/or second junctions are metal-insulator-metal tunnel junctions formed by an insulator interposed between the first and second materials.

6. The device of claim 1, wherein the closed current path has a resonance of electron or hole oscillations at an energy matched to the wavelength of the light source so that in use the electrons or holes resonantly absorb energy from each pulse of light.

7. The device of claim 1, wherein the electrons or holes are transiently heated by each pulse to a temperature of at least 1000 Kelvin.

8. The device of claim 1, wherein the first and second materials have respective first and second electron-phonon scattering times characteristic of the principal cooling mechanism for hot electrons, and wherein the pulses have a duration shorter than either the first or second electron-phonon scattering time.

9. The device of claim 1, wherein the pulse duration is at least 2, 5, 10 or 20 times shorter than the shorter of the first and second electron-phonon scattering times.

10. The device of claim 1, wherein the closed current path is shaped as a single closed loop.

11. The device of claim 1, wherein the closed current path is shaped as first and second incomplete rings of different size joined together such that the interiors of the incomplete rings form connected spaces, wherein one of the incomplete rings is dimensioned to optimize the resonance and the other of the incomplete rings is dimensioned to optimize the transient magnetic field.

12. The device of claim 11, wherein further rings are provided with said ring so that the rings form an array, and wherein the light source is arranged to direct light to cover the array of rings, so that the array of rings collectively generates a transient electromagnetic field.

13. The device of claim 1, further comprising a cooling element in thermal connection with the field generator and operable to lower at least a part of the closed current path to a temperature at which it is superconducting.

14. The device of claim 1, further comprising a heat dissipation structure to assist removal of heat generated by the induced current.

15. A magnetic recording head having a write pole made from a magnetic field generating device comprising:
a light source operable to generate pulses of light of a particular wavelength, the light having an oscillating electromagnetic field with a defined polarization; and
a magnetic field generator arranged to receive the light and comprising a closed current path made of first and second angular arc portions of first and second materials interconnected by first and second junctions;
the closed current path comprising electrons or holes which absorb energy from each pulse of light and are thereby transiently heated; and
the polarization of the light being aligned relative to the closed current path so that each pulse of light causes different amounts of transient heating of the electrons or holes at the first and second junctions so that one of the junctions becomes hotter than the other, which causes a thermally induced transient current to flow around the closed current path, thereby generating a transient magnetic field.

16. A magnetic disc drive system comprising:
a magnetic recording medium comprising a large number of magnetic domains whose alignment is used to encode data;
a magnetic recording head having a write pole made from a magnetic field generating device comprising:
i. a light source operable to generate pulses of light of a particular wavelength, the light having an oscillating electromagnetic field with a defined polarization; and
ii. a magnetic field generator arranged to receive the light and comprising a closed current path made of first and second angular arc portions of first and second materials interconnected by first and second junctions;
iii. the closed current path comprising electrons or holes which absorb energy from each pulse of light and are thereby transiently heated; and
iv. the polarization of the light being aligned relative to the closed current path so that each pulse of light causes different amounts of transient heating of the electrons or holes at the first and second junctions so that one of the junctions becomes hotter than the other, which causes a thermally induced transient current to flow around the closed current path, thereby generating a transient magnetic field,
the magnetic recording head being movable over a surface of said magnetic recording medium in order to apply a local magnetic field greater than a recording coercive field of the magnetic recording medium to selected locations of the magnetic recording medium, thereby to define alignment of magnetic domains at those locations.

17. The magnetic disc drive system of claim 16, wherein the closed current path acts as a self-aligning mask to locally heat the magnetic recording medium and thereby provide heat assisted magnetic recording.

18. The magnetic disc drive system of claim 17, wherein the said light from the light source provides the local heating for the heat assisted magnetic recording.

19. The magnetic disc drive system of claim 16, wherein a common light routing path is provided to direct the said light from the light source and further light for the heat assisted magnetic recording.

20. The magnetic disc drive system of claim 16, wherein the magnetic domains are aligned according to the local magnetic field to encode the data being written.

* * * * *